United States Patent
Sato

(10) Patent No.: US 6,985,348 B2
(45) Date of Patent: Jan. 10, 2006

(54) LAMINATED ELECTRONIC PART

(75) Inventor: Masahiro Sato, Kokubu (JP)

(73) Assignee: Kyocera Corporation, Kyoto (JP)

( * ) Notice: Subject to any disclaimer, the term of this patent is extended or adjusted under 35 U.S.C. 154(b) by 17 days.

(21) Appl. No.: 10/787,828

(22) Filed: Feb. 26, 2004

(65) Prior Publication Data

US 2004/0185278 A1     Sep. 23, 2004

(30) Foreign Application Priority Data

Feb. 26, 2003  (JP)  ............................. 2003-049334
Jun. 23, 2003  (JP)  ............................. 2003-177533

(51) Int. Cl.
*H01G 4/228*  (2006.01)
(52) U.S. Cl. ............... 361/306.3; 361/306.1; 361/321.1; 361/321.2; 361/301.1; 361/502; 361/508
(58) Field of Classification Search ........... 361/321.1, 361/321.2, 321.5, 301.1, 301.5, 502, 508, 361/509, 306.1, 306.3, 504; 310/328, 366
See application file for complete search history.

(56) References Cited

U.S. PATENT DOCUMENTS

| | | | |
|---|---|---|---|
| 4,845,399 A * | 7/1989 | Yasuda et al. ............... 310/366 |
| 5,049,221 A * | 9/1991 | Wada et al. ................ 156/151 |
| 5,254,212 A * | 10/1993 | Someji et al. ................ 216/20 |
| 6,686,092 B2 * | 2/2004 | Yageta et al. ............... 429/224 |
| 6,700,306 B2 * | 3/2004 | Nakamura et al. .......... 310/328 |

FOREIGN PATENT DOCUMENTS

JP          2003-17779          1/2003

* cited by examiner

*Primary Examiner*—Dean A. Reichard
*Assistant Examiner*—Nguyen T. Ha
(74) *Attorney, Agent, or Firm*—Hogan & Hartson LLP

(57) ABSTRACT

A laminated electronic actuator includes a pole-like laminate obtained by alternately laminating a plurality of dielectric layers and a plurality of internal electrode layers one upon the other, and two external electrode plates provided on the opposing side surfaces of the pole-like laminate, the two external electrode plates being electrically connected to every other internal electrode layer, and the one external electrode plate and the other external electrode plate being electrically connected to the different internal electrode layers. The side surfaces of the pole-like laminate on where no external electrode plate is proved have ion concentrations that are suppressed to be not higher than 10 $\mu g/cm^2$. Even when the actuator is operated by applying a high voltage, the internal electrodes are not short-circuited, effectively suppressing a change in the amount of displacement.

12 Claims, 2 Drawing Sheets

LAMINATED ELECTRONIC PART

BACKGROUND OF THE INVENTION

1. Field of the Invention

The present invention relates to a laminated electronic part. More particularly, the invention relates to a laminated electronic part such as a laminated piezoelectric actuator used for a precision positioning device in an optical device, used as a drive device for preventing vibration or used as a drive device for injecting fuel in an automotive engine.

2. Description of the Related Art

A laminated piezoelectric actuator which is a kind of the laminated electronic part utilizes an inverse piezoelectric effect in that a piezoelectric plate expands and contracts when a voltage is applied thereto. In this case, the amount of expansion and contraction of a piece of piezoelectric plate is very small. Therefore, a laminated piezoelectric actuator has heretofore been used laminating a plurality of piezoelectric plates. For example, the laminated piezoelectric actuator expands by several to several tens of microns upon applying a voltage to the piezoelectric plates, and works as a source of driving the actuator.

The above laminated piezoelectric actuator is constituted by a pole-like laminate in which piezoelectric layers and internal electrode layers are alternately laminated one upon the other, and external electrode plates provided on the opposing side surfaces of the pole-like laminate and are electrically connected to the internal electrode layers. The internal electrode layers are alternately exposed at their ends on both side surfaces of the pole-like laminate, and the alternately exposed ends are electrically connected to the external electrode plates on the side surfaces thereof. Namely, on each of the side surfaces, every other internal electrode layers are connected to the external electrode plate, and the internal electrodes neighboring up and down are connected to the different external electrode plates so as to be applied with voltages of polarities different from each other.

In producing the above laminated piezoelectric actuator, so far, a paste for internal electrodes is applied onto a ceramic green sheet that serves as a piezoelectric layer, a plurality of green sheets on which the paste is applied are laminated to prepare a laminated molded article which is, then, fired to prepare a pole-like laminate, and the side surfaces of the pole-like laminate are polished to precisely finish the shape of the product (see prior art (A): Japanese Unexamined Patent Publication (Kokai) No. 2003-17779).

SUMMARY OF THE INVENTION

In recent years, a laminated piezoelectric actuator has been driven by applying a high voltage of a high frequency to achieve a high degree of response and a large amount of displacement. In the conventional laminated piezoelectric actuator, however, the drive of the actuator tends to discontinue if a high voltage of a high frequency is applied. In particular, the discontinuation of drive easily occurs when the laminated piezoelectric actuator is driven in an environment of a high temperature and a high humidity.

It is therefore an object of the present invention to provide a laminated electronic part which does not develop inconvenience such as the discontinuation of drive even when it is driven on a high voltage of a high frequency.

According to the present invention, there is provided a laminated electronic part having a pole-like laminate obtained by alternately laminating a plurality of dielectric layers and a plurality of internal electrode layers one upon the other, wherein side surfaces of the pole-like laminate have an ion concentration which is suppressed to be not higher than 10 $\mu$g/cm$^2$.

According to the present invention, further, there is provided a laminated electronic part having a pole-like laminate obtained by alternately laminating a plurality of dielectric layers and a plurality of internal electrode layers one upon the other, the pole-like laminate having a side surface on where are exposed the ends of two kinds of the internal electrode layers to which voltages of different polarities are applied, wherein the side surface has an ion concentration which is suppressed to be not higher than 10 $\mu$g/cm$^2$.

The present inventors have studied the problems occurring in the above-mentioned laminated piezoelectric actuator, and have learned that a change in the amount of displacement (discontinuation of drive) is caused by ions existing on the side surfaces of the pole-like laminate.

Namely, in the conventional laminated piezoelectric actuators, the pole-like laminate obtained by alternately laminating the internal electrode layers and the piezoelectric layers is ground by using a surface grinding machine while supplying a grinding fluid to trim the shape. Then, the grinding fluid and the ground powder are removed by washing by using a cleaning agent such as water (pure water) and, then, external electrode plates are formed on the predetermined side surfaces of the pole-like laminate. The grinding fluid contains various kinds of ions. In particular, alkali metal ions are contained in an alkali grinding fluid that is preferably used for enhancing the grinding performance and corrosion-preventing property. The washing by using the cleaning agent is capable of removing the ground powder but is not capable of removing ions to a sufficient degree. Accordingly, ions such as alkali metal ions remain on the side surfaces of the pole-like laminate after the washing, and the concentration of the residual ions is of a level of about 15 $\mu$g/cm$^2$. On the side surfaces of the pole-like laminate on where the external electrode plates are provided, the ends of every other internal electrode layers are covered with an insulating resin to prevent the contact with the external electrode plates and are not exposed to the surface. On the side surfaces where no external electrode is provided, however, the ends of all internal electrode layers are exposed to the surfaces. When driven on a high voltage at high frequencies, therefore, the residual ions migrate between the internal electrode layers neighboring up and down with the dielectric layer (piezoelectric layer) sandwiched therebetween on the side surfaces where no external electrode plate is provided, whereby short-circuit easily occurs between the internal electrode layers to which voltages of different polarities are applied, and the drive no longer continues if short-circuit occurs.

The present invention was accomplished in view of the above knowledge, and makes it possible to effectively prevent the occurrence of short-circuit between the neighboring internal electrode layers by suppressing the ion concentration down to not higher than 10 $\mu$g/cm$^2$ on the side surfaces of the pole-like laminate where no external electrode is provided, as well as to prevent the short-circuit even when the device is driven on a high voltage at a high frequency and to effectively prevent the discontinuation of drive caused by the short-circuit.

In the present invention, further, it is desired that the surface roughness Rz (10-point average roughness, JIS B 0601-1994) is adjusted to be not larger than 3 $\mu$m on the side surfaces of the pole-like laminate. By forming the side surfaces to be smooth as described above, short-circuit is more effectively suppressed among the neighboring internal electrode layers. That is, if the side surfaces are rough on where the ends of the internal electrode layers are exposed, moisture-containing atmosphere tends to stay in the recessed portions particularly under high-temperature and high-humidity conditions. As a result, short-circuit easily occurs among the internal electrode layers. By forming smooth surfaces as described above, it is allowed to prevent the moisture-containing atmosphere from staying, and short-circuit is prevented further effectively.

In the present invention, further, it is desired that the side surfaces of the pole-like laminate are ground or polished in a direction in parallel with the internal electrode layers. As described already, the side surfaces of the pole-like laminate are ground to trim the shape and, as required, are polished to make the surfaces smooth. When the grinding or the polishing is effected, stripes of working scars are formed along the direction of working. The working scars form fine ruggedness that can be observed through an optical microscope. If the internal electrode layers neighboring up and down are connected through the working scars, however, short circuit easily occurs when the device is driven by applying a high voltage under high-temperature and high-humidity conditions. This is presumably due to that the moisture-containing atmosphere stays in the working scars and an electric current easily flows between the upper and lower internal electrode layers along the working scars. According to the present invention, however, the grinding or the polishing is effected in parallel with the internal electrode layers effectively suppressing the formation of working scars that run from one internal electrode layer toward an upper or lower neighboring internal electrode layer, so that there does not substantially exist working scars connecting the internal electrode layers to thereby effectively suppress the short-circuit caused by the working scars.

On the side surfaces of the pole-like laminate (at least on the side surfaces on where the ends of two kinds of internal electrode layers, to which voltages of different polarities are applied, are exposed, in particular, it is desired that the direction of grinding or polishing is so adjusted that the working scars extend at a ratio of not larger than 10% in a direction perpendicular to the internal electrode layers from the standpoint of preventing short-circuit among the internal electrode layers caused by the working scars. Here, the working scars extending in a direction perpendicular to the internal electrode layers stand for those having angles within ±20 degrees with respect to the direction perpendicular to the internal electrode layers.

DETAILED DESCRIPTION OF THE INVENTION

Figure 1:
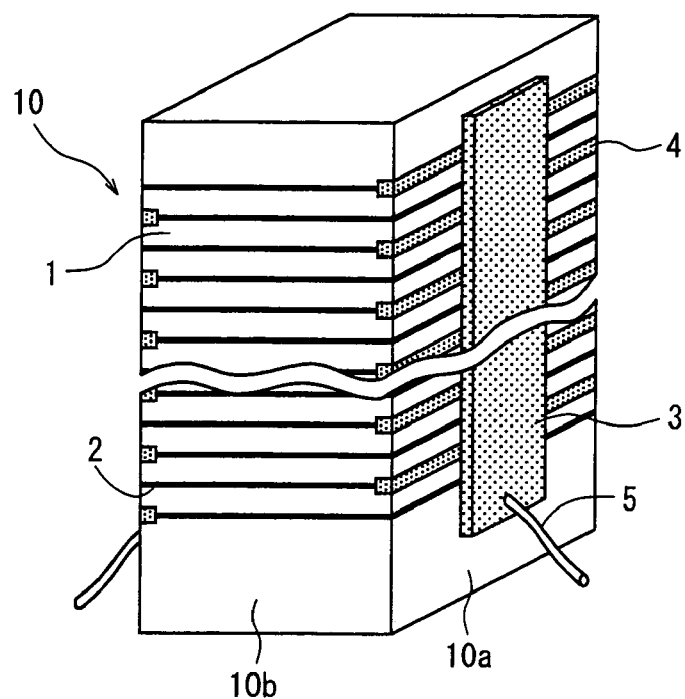
FIG. 1 is a perspective view illustrating, in cross section, a laminated piezoelectric actuator which is a representative example of a laminated electronic part of the present invention.
Figure 2:
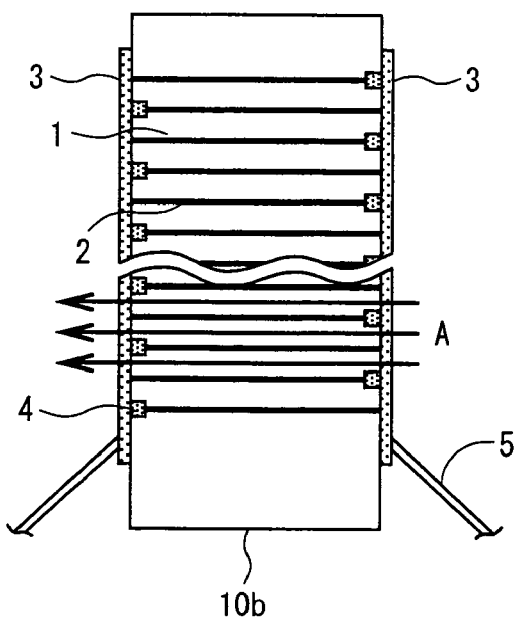
FIG. 2 is a side sectional view of the laminated piezoelectric actuator of FIG. 1.

In FIGS. 1 and 2, a laminated piezoelectric actuator of the present invention includes a square pole-like laminate 10 obtained by alternately laminating a plurality of piezoelectric (kind of dielectric) layers 1 and a plurality of internal electrode layers 2. External electrode plates 3 and 3 are provided on the opposing side surfaces 10a thereof. On the side surfaces 10a, every other ends of the internal electrode layers 2 are covered with an insulator 4, the ends of the internal electrode layers 2 which are not covered with the insulator 4 are connected to the external electrode plates 3 and 3, and lead wires 5 are connected to the external electrode plates 3 and 3. As will be understood from FIG. 1 and 2, the one external electrode plate 3 and the other external electrode plate 3 are electrically connected to different internal electrode layers 2, and voltages of different polarities are applied to the internal electrode layers 2, 2 neighboring up and down with the piezoelectric layer 1 sandwiched therebetween.

The piezoelectric layer 1 is made of a piezoelectric ceramic material comprising chiefly a perovskite composite oxide such as lead zirconate titanate $Pb(Zr, Ti)O_3$ (hereinafter abbreviated as PZT) or barium titanate $BaTiO_3$. It is desired that the piezoelectric ceramics has a high piezoelectric distortion constant d33 that represents piezoelectric characteristics thereof.

It is further desired that the piezoelectric layer 1 has a thickness (distance between the internal electrode layers 2 and 2) of 50 to 250 μm. In the laminated piezoelectric actuator, a method is employed for increasing the number of the laminated layers in order to obtain a large amount of displacement by the application of a voltage. When the thickness is within this range, it is allowed to decrease the size of the actuator and to decrease the height thereof preventing the insulation breakdown caused by too small thickness of the piezoelectric layer 1.

The internal electrode layers 2 are made of a metal material such as copper, silver, gold or silver-palladium. Being applied with a predetermined voltage, the piezoelectric layers 1 undergo the displacement based upon the inverse piezoelectric effect.

The external electrode plates 3 are made of a metal material having good electric conduction and resiliency, such as Ag, Ni, Cu, Al, W, Mo, stainless steel or Fe—Ni—Co alloy. Among them, it is desired to use Ag, Ni or stainless steel from the standpoint of their good resistance against oxidation and good electric conduction. The two pieces of external electrode plates 3 may be held being pressed onto the side surfaces 10a and 10a of the pole-like laminate 10. To impart rich expansion and contraction to. follow the displacement of the pole-like laminate 10, however, it is desired that the external electrode plates are made of electrically conducting resin plates obtained by dispersing the above metal material in a thermosetting resin such as a polyimide resin. In this case, it is desired to bury an electrically conducting mesh member in the portions connecting to the internal electrode layers 2 and to select the thickness of the external electrode plates 3 to be about 50 to about 500 μm. It is further allowable to form low-resistance portions of a thin film by vacuum evaporation, sputtering or plating on the portions where the external electrode plates 3 are to be provided, and to provide the external electrode plates 3 on the low-resistance portions.

FIGS. 1 and 2 illustrate an example in which the external electrode plates 3 are formed on the opposing side surfaces 10a and 10a of the pole-like laminate 10. Depending upon the cases, however, the external electrode plates 3 are formed over the two neighboring side surfaces 10a and 10b (i.e., the external electrode plates 3 are often formed at the corner portion of the pole-like laminate 10). In such a case, the ends of the internal electrode layers 2 to which a different voltage is applied are exposed on the portions where the external electrode plates 3 have not been formed. Besides, one portion of the ends of the internal electrode layers 2, 2, to which a different voltage is applied, may be exposed in the side surface 10*a*.

As the insulator 4 for covering the ends of the internal electrode layers 2 on the side surfaces 10*a* of the pole-like laminate 10, further, there is used a glass, an epoxy resin, a polyimide resin, a polyamideimide resin or a silicone rubber. Among them, a material having a low modulus of elasticity, such as a silicone rubber, is particularly preferably used so as to be strongly joined to the pole-like laminate 10 and to reliably follow the displacement of the pole-like laminate 10. Further, in the portions where the ends of the internal electrode layers 2 are exposed, grooves are formed maintaining a depth of 50 to 500 μm and a width of 30 to 200 μm in the direction of lamination, and the grooves are filled with the insulator 4 to cover the exposed ends of the internal electrode layers 2 with the insulator 4. Namely, every other ends of the internal electrode layers 2 are covered with the insulator 4, whereby the external electrodes 3 are electrically connected to every other internal electrode layers 2. On the opposing side surfaces 10*a* and 10*a*, further, the ends of the internal electrode layers 2 are alternately formed, and the ends on one side of the internal electrode layers 2 (ends on one side surface 10*a*) are covered with the insulator 4 and are electrically insulated from the external electrode plate 3. In this case, the ends on the other side of the internal electrode layers 2 (ends on the other side surface 10*a*) are not covered with the insulator 4 and are electrically connected to the external electrode plate 3. Therefore, the internal electrode layers 2 and 2 that are neighboring up and down with the piezoelectric layer 1 interposed therebetween are applied with voltages of different polarities through the external electrode plates 3 and 3.

The insulator 4 needs not necessarily be provided so far as electric insulation is maintained between the internal electrode layers 2 of the one side and the external electrode plates 3. For example, the ends of the internal electrode layers 2 may not be exposed on the surfaces, so that the ends of the internal electrode layers 2 are not brought into contact with the external electrode plates 3.

The lead wires 5 are connected and secured to the external electrode plates 3 by using an electrically conducting adhesive such as a solder. By connecting the lead wires 5 to the external voltage feeding members, it is allowed to apply a predetermined voltage to the external electrode plates 3.

Further, though not illustrated, the pole-like laminate 10 forming the external electrode plates 3 is covered over the whole side surfaces thereof with an electrically insulating covering resin such as a silicone(particularly, silicone rubber).

In the laminated piezoelectric actuator of the above-mentioned structure of the present invention, it is important that the ion concentration is adjusted to be not larger than 10 $\mu g/cm^2$, preferably, not larger than 5 $\mu g/cm^2$ and, most preferably, not larger than 3 $\mu g/cm^2$ on at least the side surfaces where are exposed the ends of two kinds of internal electrode layers 2, 2, to which different voltages are applied (for example, the side surface 10*b* on where no external electrode plate 3 is formed). That is, the ends of the internal electrode layers 2 are exposed on the side surfaces 10*b* of the pole-like laminate 10. When the ion concentration is high, therefore, the application of voltages of different polarities to the internal electrode layers 2 and 2 neighboring up and down with the piezoelectric layer 1 sandwiched therebetween causes ions to migrate along the electric field between the internal electrodes 2 and 2, giving rise to the occurrence of short-circuit between the internal electrode layers 2 and 2. This tendency becomes conspicuous as the applied voltage increases. When the short-circuit takes place, the drive of the actuator is discontinued and the amount of displacement becomes zero. In the present invention, however, the ion concentration is decreased down to lie in the above-mentioned range on the side surfaces 10*b* where the ends of the internal electrode layers 2 are exposed to thereby effectively prevent the occurrence of short-circuit between the internal electrode layers 2, 2 to which different voltages are applied. In this case, the ion concentration may be suppressed to lie in the above range even on the side surfaces 10*a* on where the external electrode plates 3 are formed. When the external electrode plates 3 are formed over the two neighboring side surfaces 10*a* and 10*b*, the ion concentration may be suppressed to lie in the above range in the portions where no external electrode plate 3 is formed.

The ions stem from the grinding fluid used in the step of grinding or polishing the pole-like laminate 10, and are chiefly Na ions or K ions often including $Cl^-$, $F^-$, $Ca^{2+}$, $Mg^{2+}$, etc. Namely, ions stemming from the grinding fluid are not washed away but remain on the side surfaces 10*b* causing short-circuit between the internal electrode layers 2 and 2. Therefore, means is employed as described below concerning the process of production to decrease the residual ions and, hence, to suppress the ion concentration on the side surfaces 10*b* to lie in the above range. In the present invention, further, it is desired that the total concentration of ions is suppressed to lie in the above range and that the concentration of ions of each kind is suppressed to be not larger than 1 $\mu g/cm^2$ and, particularly, not larger than 0.1 $\mu g/cm^2$. The ion concentration can be calculated by immersing the pole-like laminate 10 in ultra-pure water (ion concentration is not larger than 10 ppb) and by measuring the ion concentration of the ultra-pure water after the immersion.

In the present invention, further, it is desired that the ion concentration is adjusted as described above on at least the side surfaces 10*b* and that the surface roughness Rz (10-point average roughness, JIS B 0601-1994) is adjusted to be not larger than 3 μm and, particularly, not larger than 2 μm on the side surfaces 10*b*. That is, when the side surfaces 10*b* on where the ends of the internal electrode layers 2 are exposed, are rugged and rough, short-circuit easily occurs between the internal electrode layers 2, 2 particularly under high-temperature and high-humidity conditions. When the surface roughness Rz is smoothed to lie in the above range, on the other hand, short-circuit due to ruggedness can be effectively prevented.

The laminated piezoelectric actuator of the present invention having the side surfaces 10*b* as described above is produced by preparing the pole-like laminate 10, grinding the pole-like laminate 10 to trim the shape and, as required, polishing the pole-like laminate 10 to smooth, particularly, the side surfaces 10*b*, covering the ends of the internal electrode layers 2 with the insulator 4 as described above on the side surfaces 10*a* of the pole-like laminate 10 and, then, providing the external electrode plates 3 on the side surfaces 10*a*.

To prepare the pole-like laminate 10, first, a calcined powder of piezoelectric ceramics such as PZT, an organic high polymer binder such as acrylic resin or butyral, and a plasticizer such as DBP (dioctyl phthalate) or DOP (dibutyl phthalate) are mixed together to prepare a slurry which is, then, formed into a ceramic green sheet that serves as the piezoelectric layer 1 relying upon a known doctor blade method, calender roll method, or tape-forming method such as a slip-casting method.

Next, a binder and a plasticizer are added to a metal powder such as of silver-palladium to prepare an electrically conducting paste for the internal electrode layers. The electrically conducting paste is, then, printed maintaining a thickness of 1 to 40 μm onto the upper surfaces of the green sheets prepared above by a screen-printing method or the like method.

The green sheets on which the electrically conducting paste obtained above is printed, are laminated one upon the other. After the binder is removed at a predetermined temperature, the laminate is fired at 900 to 1200° C. to prepare the pole-like laminate 10. In this case, to form a smooth surface having a surface roughness Rz of not larger than 3 μm by suppressing the deformation or decomposition during the step of firing, it is desired that the firing is conducted in a closed firing pot. Here, it is particularly desired that the firing pot has the same composition as the sintered body obtained by firing the green sheet.

The thus obtained pole-like laminate 10 is trimmed for its shape by the grinding. The grinding is effected by using the surface grinding machine while flowing a grinding fluid. To adjust the surface roughness Rz to be not larger than 3 μm, it is desired to use the grindstone of a count of not larger than #400, preferably, not larger than #800 to grind a grinding margin of not smaller than 0.1 mm. After the grinding, the pole-like laminate 10 is washed with the cleaning agent to remove the worked powder and the grinding fluid.

In this case, it is desired that the grinding direction is in parallel with the internal electrode layers 2 as indicated by an arrow A in FIG. 2. Upon effecting the grinding in this direction, it is allowed to effectively suppress the formation of working scars in the perpendicular direction connecting the internal electrode layers 2, 2 on the side surfaces 10*b*. Of the working scars existing on at least the two side surfaces 10*b*, the ratio of the working scars running in the perpendicular direction relative to the internal electrode layers 2 can be controlled to be not larger than 10% and, particularly, not larger than 5%.

In the present invention, it is allowable to use either an alkaline grinding fluid containing an alkali metal or a non-alkaline grinding fluid without containing alkali metal. In order to decrease the concentration of alkali metal ions which occupy a majority of residual ions and to suppress the ion concentration on the side surfaces 10*b* to lie in the above-mentioned range, however, it is desired to use the non-alkaline grinding fluid. From the standpoint of enhancing the grinding property and anticorrosion property, it is desired to use an amine-type grinding fluid among the non-alkaline grinding fluids. The amine-type grinding fluid is obtained by dispersing or dissolving an amine-type surfactant in water.

As the cleaning agent, further, it is desired to use an organic solvent and, particularly, glycol ether from the standpoint of effectively removing the residual ions. When the washing is effected by using the above organic solvent, in particular, it is allowed to effectively wash and remove the residual alkali ions even by using the alkaline grinding fluid, and the ion concentration can be suppressed to lie in the above-mentioned range on the side surfaces 10*b*. Further, the washing using the above cleaning agent can be conducted in any step after the step of grinding, and can be conducted over a plurality of steps. In order to sufficiently lower the ion concentration on the side surfaces 10*b*, further, it is desired to effect the ultrasonic cleaning in the cleaning agent at least one time.

As required, further, the polishing is effected after the grinding, so that the surface roughness Rz on the side surfaces 10*b* lies within the above-mentioned range. The polishing is effected by the lapping by using grains (silicon carbide, alumina, etc.) of a particle size of, for example, #1000 to #3000. In this case, it is desired that the polishing direction is in parallel with the internal electrode layers 2 like the above-mentioned grinding direction. After the polishing, the washing is conducted by using the above-mentioned cleaning agent.

After the above grinding and polishing, the ends of every other internal electrode layers 2 are covered with the insulator 4 on the two opposing side surfaces 10*a*, 10*a* of the pole-like laminate 10. Then, the external electrode plates 3 and 3 are provided by the above-mentioned method, and the lead wires 5 are connected to the external electrode plates 3 to produce the laminated piezoelectric actuator of the present invention.

The peripheral surfaces of the laminated piezoelectric actuator are covered with a covering resin such as silicone rubber, a DC voltage of 0.1 to 3 kV/mm is applied to the pair of external electrodes 3 through the lead wires 5 to polarize the pole-like laminate 10, whereby the laminated piezoelectric actuator is completed as a product. Here, prior to being covered with the covering resin, it is desired that the pole-like laminate 10 is subjected again to the ultrasonic cleaning by using a cleaning agent of the type of an organic solvent. This further decreases the ion concentration on the side surfaces 10*b*.

Then, the lead wires 5 are connected to an external voltage feeding unit, and voltages are applied to the internal electrode layers through the lead wires 5 and the external electrode plates 3. Then, the piezoelectric layers 1 undergo a displacement to a large extent due to the inverse piezoelectric effect, and work as an automotive fuel injection valve for injecting the fuel into, for example, an engine.

Short-circuit is prevented from occurring even when the laminated piezoelectric actuator of the invention is driven on a high voltage and at a high frequency, effectively avoiding the discontinuation of drive caused by short-circuit. The laminated piezoelectric actuator of the invention favorably works when, for example, a voltage of not lower than 100 V is applied to the internal electrode layers 2. The laminated piezoelectric actuator of the invention works particularly favorably when it is applied with an AC electric field of a high frequency of not lower than 100 Hz.

The laminated electronic part of the present invention is not limited to the above-mentioned laminated piezoelectric actuator only but may be used as, for example, a laminated piezoelectric transformer or as a capacitor by using other dielectric material instead of the piezoelectric material.

Figure 3:
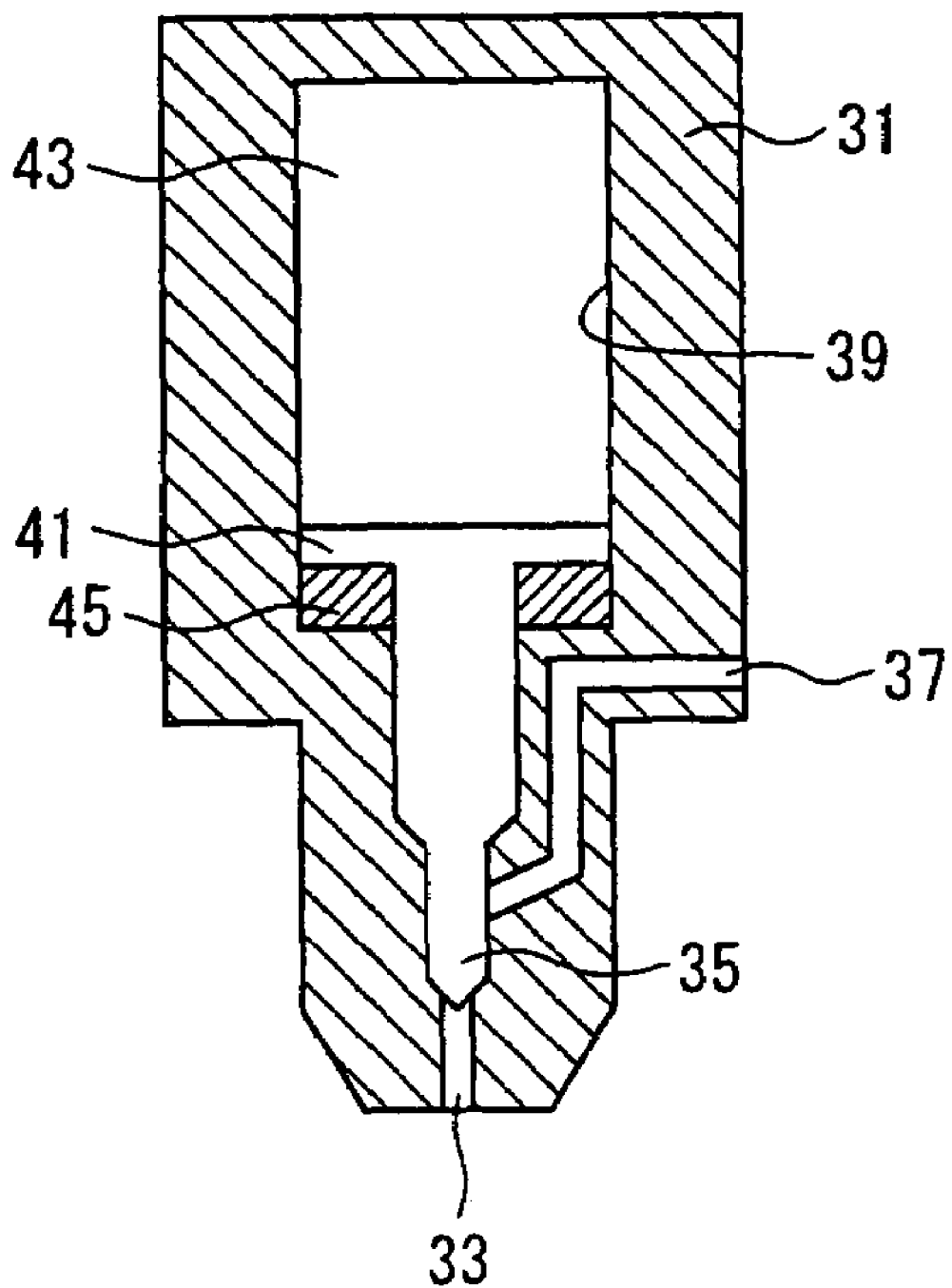
FIG. 3 is a sectional view schematically illustrating the structure of an injection device equipped with the laminated piezoelectric actuator of FIG. 1.

Further, the actuator of the present invention illustrated in FIGS. 1 and 2 can be used for an injection device of a structure illustrated in, for example, FIG. 3.

In FIG. 3, reference numeral 31 denotes a container. An injection port 33 is provided at an end of the container 31, and a needle valve 35 is held in the container 31 to open and close the injection port 33.

A fuel passage 37 is communicated with the injection port 33. The fuel passage 37 is connected to an external fuel supply and is fed with a fuel of a predetermined high pressure at all times. Therefore, when the needle valve 35 opens the injection port 33, the fuel fed into the fuel passage 37 is injected into a combustion chamber (not shown) of an internal combustion engine under the predetermined high pressure.

The needle valve 35 has a large diameter at an upper end portion thereof so as to form a piston 41 that slides in a cylinder 39 formed in the container. The above-mentioned piezoelectric actuator 43 is accommodated in the container 31.

When the piezoelectric actuator 43 in the injection device extends upon being applied with a voltage, the piston 41 is pushed down, the needle valve 35 closes the injection port 33, and the supply of fuel is interrupted. When the application of voltage discontinues, the piezoelectric actuator 43 contracts, whereby a disk spring 45 pushes the piston 41 back, and the injection port 33 is communicated with the fuel passage 37 to inject the fuel.

EXAMPLES

Experiment 1

A calcined powder of piezoelectric ceramics comprising chiefly PZT, an organic high polymer binder and a plasticizer were mixed together to prepare a slurry which was, then, formed into a ceramic green sheet having a thickness of 150 $\mu$m by a slip-casting method.

An electrically conducting paste containing silver-palladium and piezoelectric ceramics was printed maintaining a thickness of 5 $\mu$m onto the one surface of the green sheet by a screen-printing method and was dried. A hundred pieces of the green sheets on which the electrically conducting paste has been applied were laminated. Further, 10 pieces of the green sheets without the electrically conducting paste were laminated on the upper end of the laminate thereof in the direction of lamination and 20 pieces of the green sheets without the electrically conducting paste were laminated on the lower end of the laminate thereof in the direction of lamination.

Next, the laminate was pressed while being heated at 100° C. into an integrated form, and was cut into a square pole measuring 8 mm×8 mm, from which the binder was removed at 800° C. for 10 hours. The internal electrode layers and the piezoelectric layers were simultaneously fired in the atmosphere at 1130° C. for 2 hours to obtain a sintered laminate. The piezoelectric layer possessed a thickness of 100 $\mu$m.

The four side surfaces of the sintered laminate were ground by 0.2 mm each time by using a surface grinding machine and grinding fluids shown in Table 1 (grinding direction: in parallel with the internal electrode layers) and were, then, subjected to the ultrasonic cleaning (28 KHz) at 40° C. for 10 minutes by using cleaning agents shown in Table 1. Then, the side surfaces were rinsed by using pure water maintained at 40° C. and isopropyl alcohol to obtain pole-like laminates 10 (samples Nos. 1 to 5).

The grinding fluids shown in Table 1 possessed the following compositions.

Grinding fluid K: K-containing grinding fluid
10% by volume of KOH+90% by volume of water
Grinding fluid-Na: Na-containing grinding fluid
10% by volume of NaOH+90% by volume of water
Grinding fluid AM: amine-containing grinding fluid
10% by volume of diethanolamine+90% by volume of water Further, the side surfaces 10b of the pole-like laminate on where the external electrode plates are to be provided were measured for their surface roughness Rz (10-point average roughness, JIS B 0601-1994) by using a surface roughness meter to find that the side surfaces all possessed the surface roughness of 2 $\mu$m.

By using an optical microscope, further, the side surfaces 10b were measured for their working scars due to the grinding to find that the working scars extending in the perpendicular direction relative to the internal electrode layers (within ±20 degrees relative to the perpendicular) were 1% of the whole working scars.

Next, grooves of a depth of 200 $\mu$m and a width in the direction of lamination of 75 $\mu$m were formed in every other end surfaces of the piezoelectric layers 1 inclusive of the ends of the internal electrode layers 2 on the two side surfaces 10a of the pole-like laminate 2, and were filled with a silicone rubber to form insulators 4, so that every other ends of the internal electrode layers 2 were exposed on the side surfaces of the pole-like laminate 10.

Thereafter, the electrically conducting adhesive comprising silver and a polyimide resin was applied onto the side surfaces 10a of the pole-like laminate 10, a mesh member was buried in the electrically conducting adhesive, followed by curing by heating at 200° C. to form the external electrode plates 3.

Further, supersonic washing was effected at 40° C. for 10 minutes by using the washing agents shown in Table 1.

Next, the pole-like laminate 10 was rinsed by using pure water maintained at 40° C. and isopropyl alcohol.

The above samples were measured for their total concentrations of Na and K ions by the method described below. The results were as shown in Table 1.

Measurement of Ion Concentrations:

The above samples were introduced into a quartz beaker and were boiled together with ultra-pure water for one hour.

Then, the sintered bodies were taken out from the quartz beaker, and ultra-pure water was added in a suitable amount to the quartz beaker so that the amount of the solution in the quartz beaker was 50 ml. Ions in the solution were quantitatively analyzed by the ICP mass analyzer, the area of the pole-like laminate excluding the surfaces for forming the external electrodes was calculated, and the total concentration of Na and K ions on the side surfaces 10b was calculated relying upon the above calculated results. There were further existing ions, e.g., Cl$^-$, F$^-$, Ca$^{2+}$ and Mg$^{2+}$ in addition to Na and K ions, but their total amounts were not larger than 1 $\mu$g/cm$^2$.

After the rinsing, the lead wires 5 were connected by soldering to the pair of external electrodes 3 and 3 of the samples. The outer peripheral surfaces were covered with the silicone rubber by dipping. Then, a polarizing voltage of 1 kV/mm was applied to effect the polarization treatment thereby to obtain the laminated piezoelectric actuator illustrated in FIG. 1.

Upon applying a DC voltage of 200 V, the obtained laminated piezoelectric actuators produced a displacement of 10 $\mu$m.

The laminated piezoelectric actuators each in a number of ten were subjected to the drive testing by applying AC electric fields of 0 to +200 V at a frequency of 200 Hz to find a ratio of the samples (ratio of samples of acceptable quality), i.e., the laminated piezoelectric actuators that could be driven up to 1×10$^9$ cycles.

The amount of displacement was measured by securing a sample onto a vibration-proof plate and by lining an aluminum foil on the upper surface of the sample. By using a laser displacement meter, measurement was taken from a central portion and from the three peripheral portions of the device, and an average value thereof was used for the evaluation.

TABLE 1

| Sample | Grinding fluid | Cleaning agent | Surface ion concentration ($\mu$g/cm$^2$) | Ratio % of acceptable products after 10$^9$ cycles |
|---|---|---|---|---|
| *1 | K | pure water | 14 | 40 |
| *2 | Na | pure water | 16 | 20 |
| 3 | Na | glycol ether | 6 | 90 |
| 4 | AM | pure water | 7 | 90 |
| 5 | AM | glycol ether | 2 | 100 |

Samples marked with* lie outside the scope of the invention.

From the results of Table 1, in the samples Nos 1 and 2, the surface ion concentrations were not lower than 14 $\mu$g/cm$^2$, and the ratio of the products producing displacement in acceptable amounts after 1×10$^9$ cycles was as low as 40%, and short-circuit has occurred between the internal electrodes in most of these samples. In the samples of the invention, on the other hand, the concentrations of residual ions were not larger than 7 $\mu$g/cm$^2$, and more than 90% of the products were acceptable. It is therefore learned that according to the present invention, the short-circuit occurs little between the internal electrodes.

Experiment 2

A sintered laminates were obtained in the same manner as in Experiment 1, and were worked under the conditions shown in Table 2 by using a grinding fluid containing 10% of diethanolamine. Like in Experiment 1, the laminates were subjected to the ultrasonic cleaning by using a glycol ether at 40° C. for 10 minutes, and were rinsed with pure water and isopropyl alcohol. After the washing, the surface roughness and the ratio of working scars extending perpendicularly to the internal electrode layers were measured in the same manner as in Experiment 1. Thereafter, the external electrodes were formed in the same manner as in Experiment 1, subjected to the ultrasonic cleaning using the glycol ether at 40° C. for 10 minutes, and were rinsed with pure water and isopropyl alcohol. The concentration of residual ions was 2 $\mu$g/cm$^2$ as measured in the same manner as in Experiment 1, and the content of other ions such as Cl$^-$ and the like was not larger than 1 $\mu$m. Thereafter, the laminates were covered with a covering resin and weres polarized by the application of a polarizing voltage of 1 kV/mm to obtain laminated piezoelectric actuators in the same manner as in Experiment 1. The obtained laminated piezoelectric actuators were subjected to the drive testing at 150° C. by applying AC electric fields of 0 to 200 V at a frequency of 200 Hz. In the drive testing, the samples were driven up to 1×10$^9$ cycles to find a ratio of the samples of acceptable quality.

From Table 2, the samples 2, 3, 5, 6 and 7 having surface roughness of not larger than 3 $\mu$m and having ratios of working scars perpendicular to the internal electrodes of not larger than 10%, exhibited excellent characteristics permitting a small decrease in the amount of displacement as compared with the sample 1 having large surface roughness and to the sample 4 having a large ratio of working scars perpendicular to the internal electrodes.

TABLE 2

| Sample No. | Working condition | Surface roughness (Rz) | Ratio of scars perpendicular to electrode (%) | Ratio of acceptable products (%) |
|---|---|---|---|---|
| 1 | surface grinding machine | 5 | 1 | 80 |
| 2 | surface grinding machine | 2 | 1 | 100 |
| 3 | surface grinding machine | 1 | 1 | 100 |
| 4 | surface grinding machine | 1 | 15 | 80 |
| 5 | lapping machine | 0.8 | 10 | 90 |
| 6 | double disc surface grinder | 1 | 5 | 90 |
| 7 | surface grinding machine | 1 | 5 | 90 |

What is claimed is:

1. A laminated electronic part comprising a pole-like laminate having one or more side surfaces obtained by alternately laminating a plurality of dielectric layers and a plurality of internal electrode layers one upon the other, wherein the one or more side surfaces of said pole-like laminate have an ion concentration which is suppressed to be not higher than 10 $\mu$g/cm$^2$.

2. A laminated electronic part according to claim 1, wherein said ions stem from a grinding fluid and a cleaning agent used for working the pole-like laminate.

3. A laminated electronic part according to claim 1, wherein the one or more side surfaces of said pole-like laminate have a surface roughness Rz which is not larger than 3 $\mu$m.

4. A laminated electronic part according to claim 3, wherein the one or more side surfaces of said pole-like laminate are ground or polished in a direction in parallel with said internal electrode layers.

5. A laminated electronic part according to claim 4, wherein among the working scars caused by the grinding or the polishing and existing on the one or more side surfaces of said pole-like laminate, the ratio of the working scars extending in a direction perpendicular to the internal electrode layers is not larger than 10%.

6. A laminated electronic part according to claim 1, wherein the one or more side surfaces of said pole-like laminate are provided with two external electrode plates which are electrically connected to every other internal electrode layers, the one external electrode plate and the other external electrode plate being electrically connected to different internal electrode layers.

7. A laminated electronic part according to claim 6, wherein the ion concentration is suppressed to be not higher than 10 $\mu$g/cm$^2$ on all peripheral surfaces.

8. A laminated electronic part according to claim 1, wherein a voltage of not lower than 100 V is applied across the internal electrode layers.

9. A laminated electronic part according to claim 6, wherein the one or more side surfaces of said pole-like laminate are covered with a silicone.

10. A laminated electronic part according to claim 1, wherein said dielectric layers comprise a piezoelectric material and work as an actuator.

11. An injection device comprising a container having an injection port, a laminated electronic part of claim 10 contained in said container, and a valve driven by said laminated electronic part to inject a liquid through said injection port.

12. A laminated electronic part having a pole-like laminate obtained by alternately laminating a plurality of dielectric layers and a plurality of internal electrode layers one upon the other, said pole-like laminate having one or more side surfaces on where are exposed the ends of two kinds of the internal electrode layers to which voltages of different polarities are applied, wherein said one or more side surfaces have an ion concentration which is suppressed to be not higher than 10 $\mu g/cm^2$.

* * * * *